US007615290B2

(12) United States Patent
Matsuda et al.

(10) Patent No.: US 7,615,290 B2
(45) Date of Patent: Nov. 10, 2009

(54) ORGANIC ELECTROLUMINESCENT DEVICE AND DISPLAY DEVICE

(75) Inventors: Eisuke Matsuda, Kanagawa (JP); Hirokazu Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 591 days.

(21) Appl. No.: 11/215,680

(22) Filed: Aug. 30, 2005

(65) Prior Publication Data

US 2006/0049747 A1    Mar. 9, 2006

(30) Foreign Application Priority Data

Sep. 7, 2004    (JP)    ............................. 2004-259405

(51) Int. Cl.
*H01L 51/54*    (2006.01)
(52) U.S. Cl. ...................... 428/690; 428/917; 313/504; 313/506; 257/40; 257/E51.019
(58) Field of Classification Search ................. 428/690, 428/917; 313/502–509; 257/E51.001–E51.052
See application file for complete search history.

(56) References Cited

U.S. PATENT DOCUMENTS

| 6,492,041 | B2 * | 12/2002 | Ishiskawa et al. | ........... 428/690 |
| 7,276,297 | B2 * | 10/2007 | Lee et al. | ..................... 428/690 |
| 7,298,083 | B2 * | 11/2007 | Park et al. | ................... 313/505 |
| 2004/0113547 | A1 * | 6/2004 | Son et al. | ..................... 313/504 |

FOREIGN PATENT DOCUMENTS

| JP | 11-251063 | | 9/1999 |
| JP | 2002-033198 | | 1/2002 |
| JP | 2003/217867 A | * | 7/2003 |
| JP | 2003/234193 A | * | 8/2003 |
| JP | 2003-255377 | | 9/2003 |
| JP | 2003-303681 | | 10/2003 |
| JP | 2004-165017 | | 6/2004 |
| JP | 2005-056848 | | 3/2005 |
| JP | 2005-222759 | | 8/2005 |
| WO | 2004/054326 | | 6/2004 |

OTHER PUBLICATIONS

Lee et al., "Reduction of Contact Resistivity between Al Alloy Layer and Indium Tin Oxide Layer by Fluorine Plasma Treatment," Japanese Journal of Applied Physics, vol. 41, pp. L412-L414, Apr. 2002.*

* cited by examiner

*Primary Examiner*—D. Lawrence Tarazano
*Assistant Examiner*—Michael Wilson
(74) *Attorney, Agent, or Firm*—Sonnenschein Nath & Rosenthal LLP

(57) ABSTRACT

An organic electroluminescent device comprising an organic layer at least having a light emission layer provided between an anode and a cathode, wherein the anode has at least one layer comprised of an alloy containing aluminum as a main ingredient, and the alloy contains at least one element whose work function is relatively smaller than that of the main ingredient as a secondary ingredient, the device being relatively inexpensive, having high reliability and capable of reducing disconnection due to hillock or migration.

6 Claims, 3 Drawing Sheets

ORGANIC ELECTROLUMINESCENT DEVICE AND DISPLAY DEVICE

CROSS REFERENCES TO RELATED APPLICATIONS

The present invention contains subject matter related to Japanese Patent Application JP 2004-259405 filed in the Japanese Patent Office on Sep. 7, 2004, the entire contents of which being incorporated herein by reference.

BACKGROUND OF THE INVENTION

1. Field of the Invention

The present invention concerns an organic electroluminescent device and a display device and, more in particular, it relates to an organic electroluminescent device using an anode as a reflection electrode and a display device using the same.

2. Description of the Related Art

In an organic electroluminescent device utilizing electroluminescence (hereinafter referred to as EL) of an organic material (so-called organic EL device), an organic layer formed by stacking an organic hole transport layer or an organic light emission layer is disposed between an anode and a cathode, and it has attracted attention as a light emission device capable of emitting light at high luminosity by low DC voltage driving.

FIG. 5 is a cross sectional view showing an example of a constitution of the organic electroluminescent device described above. An organic electroluminescent device 101 shown in the drawing is disposed on a transparent substrate 102, for example, formed of glass and has an anode 103 disposed on the substrate 102, an organic layer 104 disposed on the anode 103, and a cathode 105 disposed on the organic layer 104. The organic layer 104 has a constitution of stacking a hole injection layer 104a, a hole transport layer 104b, and an electron transporting light emission layer 104c successively from the side of the anode 103. In the organic electroluminescent device 101, electrons injected from the cathode 105 and holes injected from the anode 103 are re-combined in the light emission layer 104c, and a light generated upon re-combination is taken out by way of the anode 103 or the cathode 105. The organic electroluminescent device also includes those having a constitution of stacking a cathode, an organic layer and an anode successively from the side of the substrate.

In an active matrix type display device in which a thin film transistor (hereinafter referred to as TFT) for driving each of organic electroluminescent devices is disposed on a substrate, it is advantageous for improving the opening ratio of a light emission portion to adopt a top emission structure of taking out emitted light generated in the organic electroluminescent device from the side opposite to the substrate. Further, improvement of the opening ratio can decrease the density of current applied to each of devices for obtaining necessary luminance to extend the life of the device.

Then in the organic electroluminescent device 101 of the constitution, for example, shown in FIG. 5, the anode 103 disposed on the side of the substrate 102 is used as a reflection electrode and the cathode 105 is used as a transparent or semi-transparent electrode. Then, for taking out the emitted light efficiently from the side of the cathode 105, it is necessary to constitute the anode 103 with a material of high reflectance.

For the material constituting the anode 103, it has been proposed to use, for example, silver (Ag) or a silver-containing alloy (refer to JP-A Nos. 2003-77681 and 2003-234193). Further, JP-A No. 2003-234193 also proposes the use of an aluminum (Al) alloy comprising copper (Cu), palladium (Pd), gold (Au), nickel (Ni), or platinum (Pt) as an secondary ingredient metal.

SUMMARY OF THE INVENTION

However, use of silver or silver-containing alloy as the anode results in various problems such as short-circuit caused by generation of hillocks or wire disconnection caused by migration during driving, particularly, driving at high temperature of the organic electroluminescent device.

By the way, in a case where an aluminum (Al) alloy is used as the anode, a metal of high work function (copper, palladium, gold, platinum, etc.) is contained up to about 20 to 30% in order to compensate a relatively small work function of aluminum. In this case, palladium, gold and platinum are noble metal and increase the cost.

In view of the above, the present invention intends to provide an anode of a relatively reduced cost having a process durability while maintaining reflection characteristics as a reflection electrode thereby providing an organic electroluminescent device and a display device of high reliability.

According to an embodiment of the present invention, there is provided an organic electroluminescent device comprising an organic layer having at least a light emission layer provided between an anode and a cathode, the anode has a first layer comprising an alloy containing aluminum as a main ingredient, and the alloy contains at least one element whose function is relatively smaller than that of the main ingredient as a secondary ingredient.

Further, according to another embodiment of the present invention, there is provided a display device in which a plurality of organic electroluminescent devices emit light in accordance with the amount of the current supply, wherein the organic electroluminescent device has an organic layer having at least a light emission layer provided between the anode and the cathode, the anode has a first layer comprising an alloy containing aluminum as a main ingredient and the alloy contains at least one element whose function is relatively smaller than that of the main ingredient a secondary ingredient.

In one embodiment of the present invention, since the device contains aluminum of high reflectance as a main ingredient and an element whose work function is relatively smaller than that of the main ingredient as a secondary ingredient, an anode having high reflectance, stable and of a relatively reduced cost can be obtained. That is, use of aluminum as the main ingredient can prevent occurrence of hillock or migration in the production process or in the driving state, and can prevent short-circuit of the anode and disconnection of wirings attributable to them. Further, the stability of the aluminum alloy is improved by adding at least one element whose work function is relatively smaller than that of the main ingredient as a secondary ingredient. Accordingly, it is possible to provide an organic electroluminescent device and a display device of high reliability.

DESCRIPTION OF THE ACCOMPANYING DRAWINGS

DESCRIPTION OF PREFERRED EMBODIMENTS OF THE INVENTION

Figure 1:
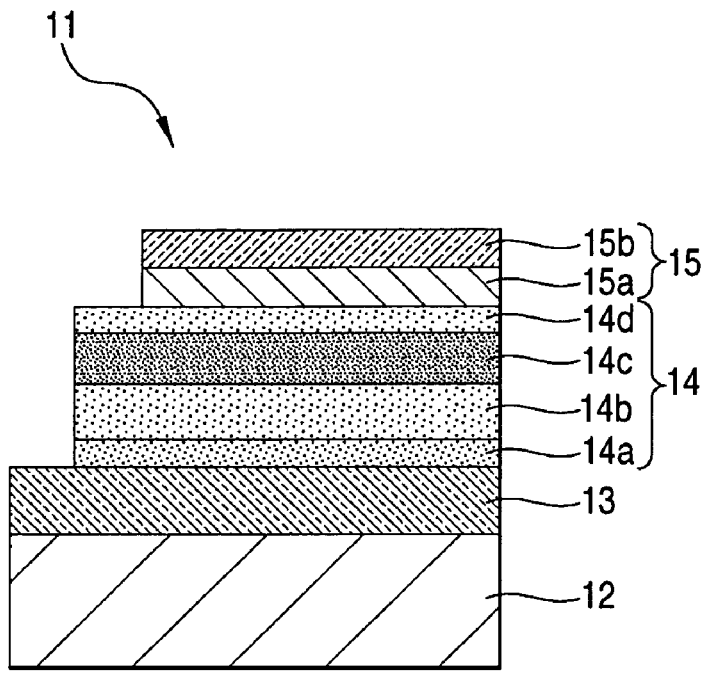
FIG. 1 is a cross sectional view showing the constitution of an organic electroluminescent device according to an embodiment of the present invention.

FIG. 1 is a cross sectional view showing an example of a constitution of an organic electroluminescent device according to an embodiment of the present invention. An organic electroluminescent device 11 shown in the drawing has an anode 13 disposed on a substrate 12, an organic layer 14 stacked on the anode 13, and a cathode 15 disposed on the organic layer 14.

Description is to be made to the constitution of an organic electroluminescent device of a top surface light emitting system in which an emitted light formed when holes injected from the anode 13 and electrons generated in the charge generation layer 15 are combined in a light emission layer 14c is taken out on the side of the cathode 15 opposite to the substrate 12.

At first, the substrate 12 on which the organic electroluminescent device 11 is disposed is properly selected from transparent substrates such as glass, silicon substrates or, further, film-like flexible substrates, etc. and used. Further, in a case where the driving system of the display device constituted by using the organic electroluminescent device 11 is an active matrix system, a TFT substrate in which TFTs are disposed on every pixel is used as the substrate 12. The display device has a constitution in which the organic electroluminescent device 11 of the top surface light emitting system is driven by using TFTs.

The anode 13 has a first layer comprising an alloy containing aluminum as a main ingredient in which the first layer contains at least one element whose work function is relatively smaller than that of the main ingredient as a secondary ingredient. As the secondary ingredient, a lanthanoide element is preferable. The work function of the lanthanoide series element is not large but incorporation of such elements improves the stability of the anode and satisfies the hole injection property of the anode. The secondary ingredient may also include other elements such as silicon (Si) and copper (Cu) in addition to the lanthanoide element.

The content of the secondary ingredient metal in the aluminum alloy layer is preferably about 10 wt % or less. This can maintain the anode stably while keeping the reflectance of the aluminum alloy in the manufacturing process of the organic electroluminescent device and, further, improve the fabrication accuracy and chemical stability. Further, the conductivity and the adhesion with the substrate 12 of the anode 13 are also satisfactory.

Further, the anode 13 may also have a second layer of excellent light transmittance on the side of the aluminum alloy layer in contact with the organic layer 14. The second layer can include, for example, at least one of an oxide layer of an aluminum alloy layer, molybdenum oxide, zirconium oxide, chromium oxide, and tantalum oxide. In a case where the second layer is an oxide layer of an aluminum alloy (including spontaneous oxide film) and the secondary ingredient contains a lanthanoide element, since the oxide of the lanthanoide element has high transmittance, high reflectance can be kept at the surface of the layer comprising the aluminum alloy.

Further, the second layer may also be a transparent conductive layer such as of ITO (Indium Tin Oxide) or IZO (Indium Zinc Oxide). The conductive layer can improve the electron injection property of the anode.

On the other hand, the anode 13 may be provided with a conductive layer to the aluminum alloy layer on the side in contact with the substrate 11 for improving adhesion between the anode 13 and the substrate 12. The conductive layer includes a transparent conductive layer such as formed of ITO or IZO.

In a case where the driving system of the display device constituted by using the organic electroluminescent device 11 is an active matrix system, the anode 13 is patterned on every pixel to which the TFTs are disposed. Then, an insulative film not illustrated in the drawing is disposed to the upper layer of the anode 13, and the surface of the anode 13 of every pixel is exposed through the opening of the insulative film.

Then, the organic layer 14 is to be described. The organic layer 14 is formed by stacking a hole injection layer 14a, a hole transport layer 14b, a light emission layer 14c and an electron transport layer 14d successively on the side of the anode 13. Each of the layers has an organic layer formed, for example, by a vacuum deposition method or other method such as a spin coating method.

In each of the layers described above, usual materials can be used for the hole transport layer 14b, the light emission layer 14c and the electron transport layer 14d.

For example, hole transport material such as benzidine derivatives, styryl amine derivatives, triphenyl methane derivatives, and hydrazone derivatives can be used for the hole transport layer 14b. Further, the light emission layer 14c may also be a thin organic film containing a slight amount of an organic substance such as perylene derivatives, coumarin derivatives, pyrane dyes, and triphenylamine derivatives. In this case, this can be formed by co-vapor deposition of a slight amount of molecules to the material constituting the light emission layer 14c.

Then, for the hole injection layer 14a in contact with the anode 13, an appropriate material may be selected depending on the material constitution of the anode 13.

For example, in a case where the boundary of the anode 13 on the side of the organic layer 14 comprises the aluminum alloy layer described above or an oxide layer of the aluminum alloy layer, the hole injection layer 14a may be constituted by using a compound represented by the following formula (1):

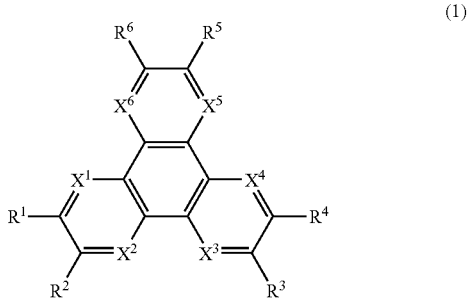

in which each of $R^1$ to $R^6$ each independently represents a substituent selected from a hydrogen atom, a halogen atom, a hydroxyl group, an amino group, an arylamino group, a substituted or not-substituted carbonyl group of 20 or less carbon atoms, a substituted or not-substituted carbonyl ester group of 20 or less of carbon atoms, a substituted or not-substituted alkyl group of 20 or less of carbon atoms, a substituted or not-substituted alkenyl group of 20 or less of carbon atoms, a substituted or not-substituted alkoxyl group of 20 or less of carbon atoms, a substituted or not-substituted aryl group of 30 or less of carbon atoms, a substituted or not-substituted heterocyclic group of 30 or less of carbon atoms, a nitrile group, a cyano group, a nitro group, or a silyl group, adjacent $R^m$ (m=1 to 5) may join to each other by way of a cyclic structure, and $X^1$ to $X^6$ each represents independently a carbon atom or nitrogen atom.

A specific example of the compound includes the material represented by the following formula (2). By constituting the hole injection layer 14a using the compound of the formula (1), holes can be injected sufficiently even in a case where the work function of the anode 13 is not large.

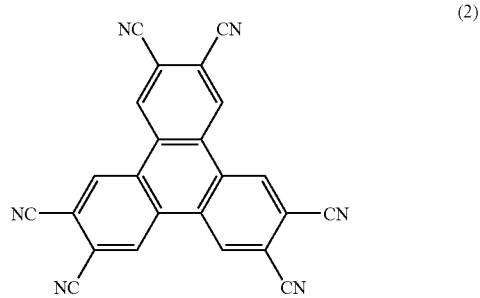

(2)

Specific examples of the compound represented by the formula (1) constituting the hole injection layer 14a are not restricted only to the structure shown in the formula (2) but may be those in which the portions for $R^1$ to $R^6$ and the portion for $X^1$ to $X^6$ in the formula (1) are substituted independently with the substituents as has been described for the formula (1).

Further, in a case where the boundary of the anode 13 on the side of the organic layer 14 comprises a layer containing at least one of ITO, IZO, molybdenum oxides, zirconium oxides, chromium oxides, and tantalum oxides, the hole transport layer 14a may also comprise compounds used generally as the hole injection material such as those having an arylamine skeleton in addition to the compound of the general formula (1).

In the organic layer 14 described above, each of the layers 14a to 14d constituting the layer may also have other functions. As an example, the light emission layer 14c may be an electron transporting light emission layer that also functions as the electron transport layer 14d and, on the other hand, may be a hole transporting light emission layer that also functions as the hole transport layer 14c. Further, each of the layers 14a to 14d may have a stacked structure. For example, the light emission layer 14c may have a stacked structure of a blue light emission layer, a green light emission layer, and a red light emission layer to constitute an organic electroluminescent device that emits white light.

Then, the cathode 15 may have a structure in which a layer in contact with the organic layer 14 is constituted by using a material having a small work function and have a favorable light transmittance. For such a constitution, the cathode 15 may have a structure formed by stacking, for example, a first layer 15a and a second layer 15b successively on the side of the anode 13 and, further stacking a third layer (not illustrated) depending on the case.

The first layer 15a has a material with a small work function and having favorable light transmittance. The material includes, for example, alkali metal oxides such as $Li_2O$, $Cs_2O$, LiF or $CaF_2$, alkali metal fluorides, alkaline earth metal oxides, alkaline earth fluorides. Further, the second layer 15b has a material having light transmittance and favorable conductivity such as a thin film MgAg electrode or a Ca electrode. Particularly, in a case where the organic electroluminescent device 11 is a top surface light emission device having a cavity structure of oscillating an emitted light between the anode 13 and the cathode 15 and taking out the same, the second layer 15b has been constituted by using a semi-transmitting reflection material such as Mg—Ag. Further, a third layer optionally stacked further is formed as a seal electrode for suppressing the degradation of the electrode.

The first layer 15a, the second layer 15b and the third layer described above are formed by a method such as vacuum deposition, sputtering or plasma CVD. Further, in a case where the driving system of the display device having the organic electroluminescent device is an active matrix system, the cathode 15 may be formed in the state of a solid film over the substrate 12 being insulated from the anode 13 by an insulative film not illustrated in the drawing covering the circumferential periphery of the anode 13 and the organic layer 14 and used as a common electrode for each of the pixels.

The organic electroluminescent device used for the embodiment of the present invention is not restricted to the organic electroluminescent device used for an active matrix type display device using a TFT substrate but is also applicable as an organic electroluminescent device for use in a passive system display device and can provide identical effects.

In the embodiment described above, description has been made to a case of "top surface light emission type" using the substrate 12 as the anode 13 and taking out light emission from the cathode 15 disposed on the opposite side. However, the invention is also applicable to a "transmittance type" organic electroluminescent device of forming the substrate 12 with a transparent material and stacking the stacked structure explained with reference to FIG. 1 in the opposite direction from the side of the substrate 12 formed of the transparent material, and using the anode 13 as the upper electrode. Also in this case, identical effect can be obtained.

Further, the organic electroluminescent device of the invention described for the embodiment is also applicable to a stacked type organic electroluminescent device formed by stacking units of organic layers each having the light emission layer (light emission units). The stacked type referred to herein has a structure also called as a multi-photon emission device (MPE device), which can be an organic electroluminescent device in which each of the light emission units is partitioned by an insulative charge generation layer, for example, as described in JP-A No. 2003-272860.

EXAMPLE

Then, manufacturing procedures for the organic electroluminescent device of specific examples of the invention and comparative examples relative to the examples, as well as the result of evaluation thereof are to be described.

Examples 1 to 7

In each of the Examples 1 to 7, an organic electroluminescent device 11 of the constitution described with reference to FIG. 1 was formed in the embodiment described above. In each of the examples, respective materials and stacked structures shown in the following Table 1 were used for the anode 13 and the hole injection layer 14a. Description is to be made at first to the production procedures of an organic electroluminescent device 11 of Examples 1 to 7.

TABLE 1

| | Anode 13 | Reflectance of anode (450 nm) | Hole injection layer 14a | (a) Light emission efficiency (6 V) | (b) Number of short-circuits |
|---|---|---|---|---|---|
| Example 1 | Al—Nd | 90% or more | Formula (2) | 4.2 cd/A | — |
| Example 2 | Al—Ni—Nd | " | " | 4.1 cd/A | — |
| Example 3 | Al—Nd/ITO | 85% or more | " | 3.7 cd/A | 3/10(N) |
| Example 4 | Al—Nd/IZO | " | 2-TNATA | 3.6 cd/A | — |
| Example 5 | Al—Nd/TaO | " | Formula (2) | 3.6 cd/A | — |
| Example 6 | ITO/Al—Nd/ITO | 80% or more | 2-TNATA | 3.7 cd/A | — |
| Example 7 | IZO/Al—Nd/IZO | " | " | 3.5 cd/A | — |
| Comp. Example 1 | Ag—Pd—Cu/ITO | 85% | Formula (2) | 3.8 cd/A | 9/10(N) |
| Comp. Example 2 | Ag—Pd—Cu | 95% or more | " | 4.4 cd/A | — |

2-TNATA: 4,4',4"-tris(2-naphthylphenylamino)triphenylamine

At first, each of anodes 13 was formed on a substrate 12 having a glass plate, sized 30 mm×30 mm in each of examples.

Figure 2:
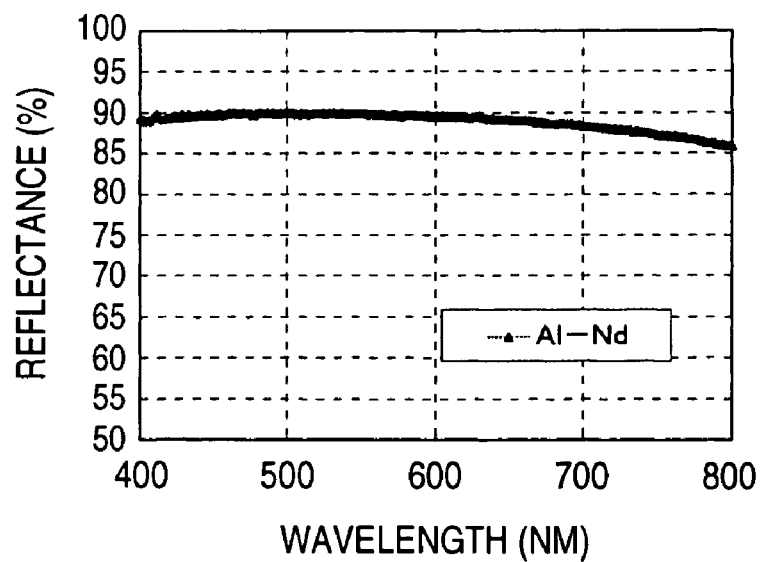
FIG. 2 is a graph showing the reflectance of an anode of Example 1.

In Examples 1 to 2, an anode 13 was formed using an aluminum alloy layer containing at least one element of neodymium (Nd) as the lanthanoide element and nickel (Ni). As shown in Table 1, Al—Nd(10%) layer was formed in Example 1 and an Al—Ni(4%)-Nd(3%) layer was formed in Example 2. Each of the layers had a film thickness of 120 nm. The reflectance of the anode 13 having each of the single layers was 90% or more to a light at a wavelength of 450 nm, respectively. Further, FIG. 2 shows a graph for wavelength-reflectance at the anode 13 typically having the Al—Nd layer of Example 1. As shown in the graph, it was confirmed that the anode 13 of Example 1 showed a favorable reflectance for a wide range of wavelength. This was identical for the anode 13 of Example 2.

In Examples 3 to 5, an anode 13 of a two-layered structure was formed in which each of transparent conductive layers was formed on an Al—Nd layer as an aluminum alloy layer (thickness: 120 nm) used in Example 1. As shown in Table 1, an ITO layer (film thickness: 10 nm) in Example 4, an IZO layer (film thickness: 10 nm) in Example 5, and a TaO layer (film thickness: 1 nm) in Example 6 were formed each as a transparent conductive layer on the Al—Nd layer. The reflectance of each anode 13 was 85% or more to a light at a wavelength of 450 nm, respectively, and it was confirmed that favorable reflectance was shown for a wide range of wavelength in the same manner as in the anode 13 of Example 1.

In Examples 6 to 7, an anode 13 of a three-layered structure was formed by putting the Al—Nd layer (film thickness: 120 nm) as an aluminum alloy layer used in Example 1 between each of transparent conductive layers. As shown in Table 1, ITO was formed in Example 6 and IZO was formed in Example 7 each as the transparent conductive layer. Then, the film thickness for the transparent conductive film of the lower layer was set to 20 nm thickness, while the transparent conductive film of the upper layer was set to 10 nm thickness both in Examples 6 and 7. The reflectance of each of the anodes 13 was 85% to the light at a wavelength of 450 nm, and it was confirmed that satisfactory reflection ratio was shown in a wide range of a wavelength like the anode 13 in Example 1.

After forming the anode 13 of the constitution of each of Examples 1 to 7 as described above, a cell for use in an organic electroluminescent device in which a portion other than the light emission region of 2 mm×2 mm size was masked with an insulative film (not illustrated) was manufactured by $SiO_2$ vapor deposition.

Then, a hole injection layer 14a was formed on the anode 13. In this case, a hole injection layer 14a of 15 nm thickness was formed by vapor deposition of the material shown by the following equation (2) in Examples 1 to 3, and 5, and 2-TNATA (4,4',4"-tris[2-naphthylphenylamino]triphenylamine) in Examples 4, 6, 7 each as a vapor deposition film (vapor deposition rate of 0.2 to 0.4 nm), as shown in Table 1.

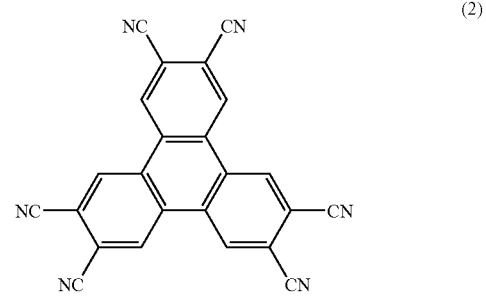

(2)

Then, as a hole transport layer 14b, α-NPD (α-naphthyl phenyl diamine) was formed to a thickness of 15 nm (vapor deposition rate: 0.2 to 0.4 nm/sec).

Further, the light emission layer 14c was deposited by using ADN (anthracene dinaphthyl) as a host and BD-052x (trade name of product manufactured by Idemitsu Kosan Co.) as a dopant and depositing the materials to a total film thickness of 32 nm by a vacuum vapor deposition method such that the dopant concentration was 5% by the film thickness ratio of in each of examples.

Then, as an electron transport layer 14d, Alq3 (8-hydroxy quinoline aluminum) was vapor deposited by 18 nm.

After forming the organic layer 14 of a structure formed by stacking the hole injection layer 14a to the electron transport layer 14d, LiF was formed as a first layer 15a of the cathode 15 to a thickness of about 0.3 nm by a vacuum vapor deposition method (vapor deposition rate—0.01 nm/sec) and then MgAg was formed to a thickness of 10 nm by a vacuum vapor deposition method as a second layer 15b. Thus, the cathode 15 of the two-layered structure was disposed on the organic layer 14.

Organic electroluminescent device 11 for Examples 1 to 7 were thus obtained.

Comparative Example 1

In Comparative Examples 1 and 2, organic electroluminescent devices each having an anode using a silver alloy instead of the aluminum alloy were manufactured in the manufacturing procedures for the organic electroluminescent device of Examples 1 to 7 described above. That is, in Comparative Example 1, an anode 13 of a two-layered structure was disposed by forming an Ag—Pd—Cu layer and forming an ITO layer in each of examples. Further, in Comparative Example 2, an anode 13 of a single-layered structure containing Ag—Pd—Cu was disposed. Further, as the hole injection layer 14a, the compound of the formula (2) like that in Example 1 or the like was used.

<Evaluation Result-1>

For the organic electroluminescent devices of Examples 1 to 7 and Comparative Examples 1 and 2 manufactured as described above, the light emission efficiency was measured and the result of measurement is shown in conjunction with the light emission efficiency (a) in Table 1. The light emission efficiency (cd/A) of the organic electroluminescent device is a value measured upon application of a voltage at 6V.

From the result, as in Examples 1 to 2, it was confirmed that even in a case where the anode was constituted only with an alloy layer containing aluminum and an element whose work function is smaller than that of aluminum, holes and electrons could be joined to emit light in the light emission layer 14c within the organic layer 14. Further, the anode 13 was formed so as to provide a reflectance as high as at 90% or more and it was also confirmed that the emitted light in the light emission layer 14 was taken out efficiently to the outside.

<Evaluation Result-2>

Organic electroluminescent devices of the constitution of Example 3 and Comparative Example 1 were manufactured each by the number of 10, and the number of short-circuits in a case of driving for 300 hours at high temperature of 80° C. was compared. The result is shown in conjunction with the number of short-circuits (b) in Table 1.

From the result, in the organic electroluminescent device of Comparative Example 1 in which the anode was formed of a silver alloy, short-circuit occurred by 9 out of 10 devices by driving at high temperature. On the contrary, in the organic electroluminescent device of Example 3 in which the anode was formed of the aluminum alloy, devices suffering from short-circuit by driving at high temperature were 3 out of 10 devices. Accordingly, it was confirmed that the heat resistance of the anode is improved by using the aluminum alloy.

<Evaluation Result-3>

Figure 3:
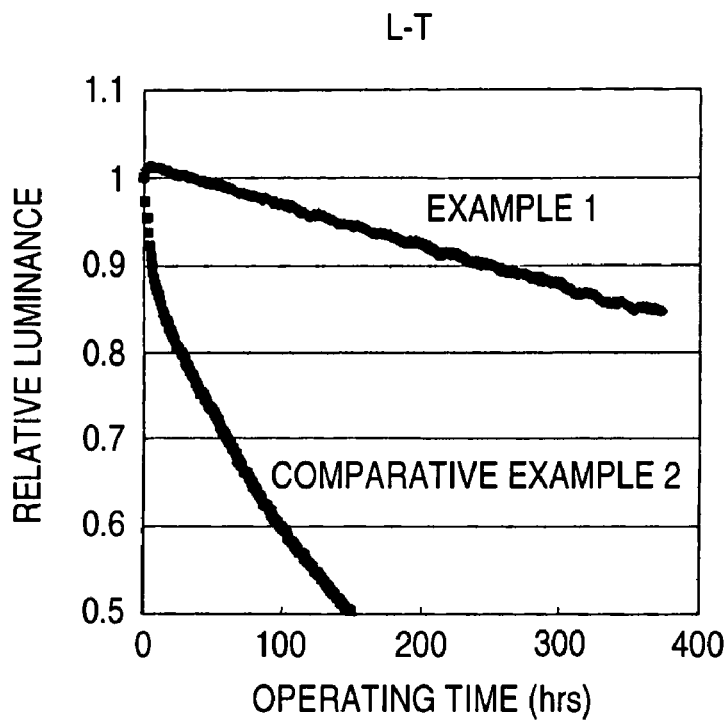
FIG. 3 is a graph showing a relation for driving time-relative luminance of an organic electroluminescent device of Example 1 and Comparative Example 2.
Figure 4:
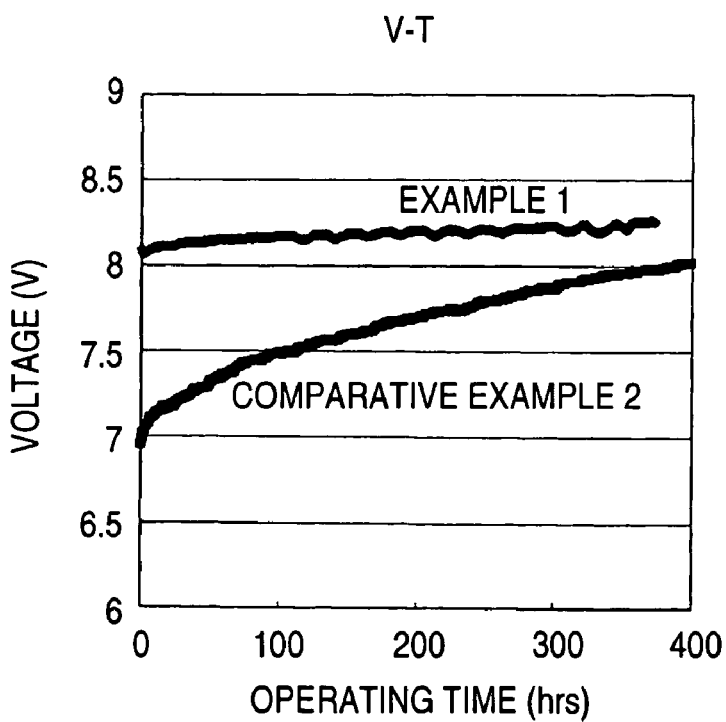
FIG. 4 is a graph showing a relation for driving time-driving voltage of organic electroluminescent devices of Example 1 and Comparative Example 2.
Figure 5:
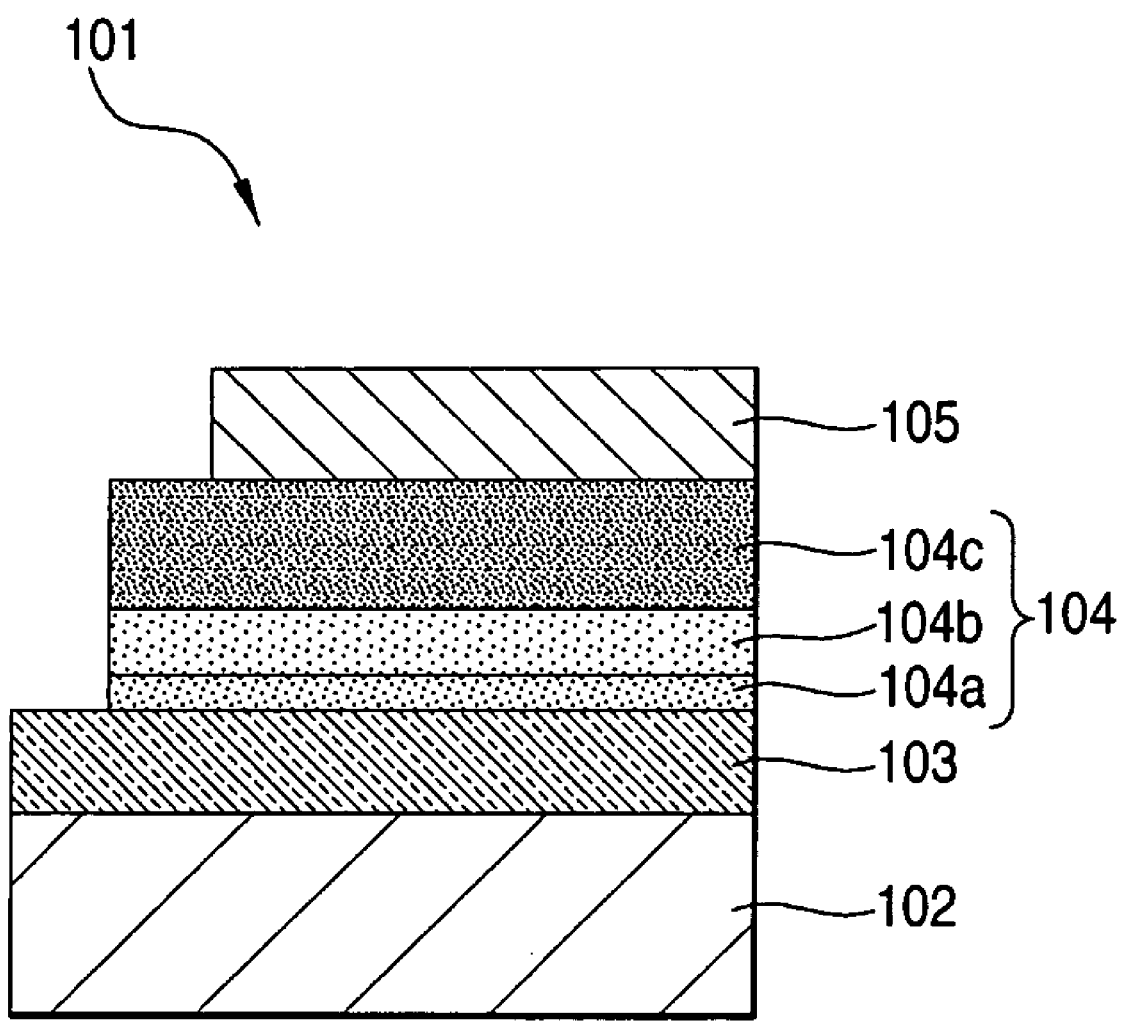
FIG. 5 is a cross sectional view showing the constitution of an organic electroluminescent device according to an existent embodiment.

FIG. 3 shows a result of measuring the relation of driving time (operating time)–(relative luminance) for the organic electroluminescent devices of the constitution of Example 1 and Comparative Example 2. Further, FIG. 4 shows the result of measuring the relation of operating time—driving voltage for the devices described above.

From the result, it was confirmed that degradation of the relative luminance and the increase of the driving voltage relative to the driving time were suppressed in the organic electroluminescent device of Example 1 having the anode containing the aluminum alloy layer compared with the organic electroluminescent device of Comparative Example 2 having the anode comprising a silver alloy layer.

It should be understood by those skilled in the art that various modifications, combinations, sub-combinations and alterations may occur depending on design requirements and other factors insofar as they are within the scope of the appended claims or the equivalents thereof.

What is claimed is:

1. An organic electroluminescent device comprising:
   an anode;
   a cathode; and
   an organic layer, said organic layer formed by at least two layers, including (1) a light emission layer between the anode and the cathode, and (2) a layer in contact with the anode, which comprises a material represented by the following formula (2);

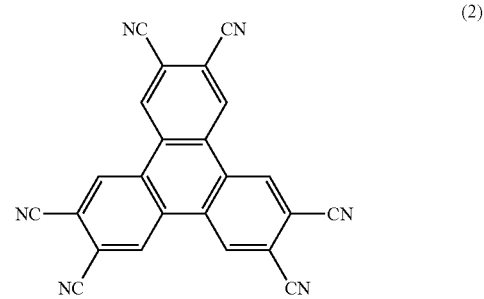

wherein,
   the anode includes a first layer comprised of an alloy containing at least (1) aluminum as a main component, and (2) neodymium and (3) nickel as a secondary component.

2. An organic electroluminescent device according to claim 1, wherein the content of the secondary ingredient is 10 wt % or less.

3. An organic electroluminescent device according to claim 1, wherein the secondary ingredient contains silicon or copper.

4. An organic electroluminescent device according to claim 1, wherein the anode further includes a second layer comprised of an oxide of the alloy at the organic layer side.

5. An organic electroluminescent device according to claim 1, wherein the anode is light reflective, the cathode is light transmissive and the light from the light emission layer is emitted outside mainly from the cathode.

6. A display device in which a plurality of organic electroluminescent devices emit light in accordance with the amount of current supply, the organic electroluminescent device comprising an anode;

a cathode; and an organic layer, said organic layer formed by at least two layers including (1) a light emission layer between the anode and the cathode, and (2) a layer in contact with the anode, which comprises a material represented by the following formula (2):

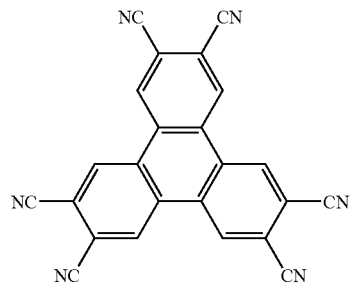

(2)

wherein, the anode has a first layer comprising an alloy containing (1) aluminum as a main component and (2) neodymium and (3) nickel as a secondary component.

* * * * *